US008917535B2

(12) United States Patent
Lee et al.

(10) Patent No.: US 8,917,535 B2
(45) Date of Patent: Dec. 23, 2014

(54) VARIABLE RESISTANCE MEMORY DEVICE AND RELATED METHOD OF OPERATION

(71) Applicant: Samsung Electronics Co., Ltd., Suwon-si, Gyeonggi-do (KR)

(72) Inventors: Cheon An Lee, Hwaseong-Si (KR); Donghun Kwak, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 48 days.

(21) Appl. No.: 13/648,296

(22) Filed: Oct. 10, 2012

(65) Prior Publication Data
US 2013/0201750 A1 Aug. 8, 2013

(30) Foreign Application Priority Data

Feb. 8, 2012 (KR) .......................... 10-2012-0012928

(51) Int. Cl.
*G11C 11/00* (2006.01)
(52) U.S. Cl.
USPC .......................................... 365/148; 365/163
(58) Field of Classification Search
CPC ................................... G11C 13/0069
USPC ................................ 365/148, 163
See application file for complete search history.

(56) References Cited

U.S. PATENT DOCUMENTS

| 7,529,124 | B2* | 5/2009 | Cho et al. .................. 365/163 |
| 7,571,901 | B2 | 8/2009 | Philipp |
| 7,826,248 | B2 | 11/2010 | Xi et al. |
| 7,907,437 | B2 | 3/2011 | Lee et al. |
| 7,978,497 | B2 | 7/2011 | Maejima |
| 8,014,190 | B2 | 9/2011 | Lee et al. |
| 2008/0062740 | A1 | 3/2008 | Baek et al. |
| 2009/0296458 | A1* | 12/2009 | Lee et al. .................. 365/163 |
| 2010/0027326 | A1* | 2/2010 | Kim et al. .................. 365/163 |
| 2011/0188292 | A1 | 8/2011 | Joo et al. |
| 2012/0300530 | A1* | 11/2012 | Meade et al. .................. 365/148 |

FOREIGN PATENT DOCUMENTS

| KR | 100755409 B1 | 8/2007 |
| KR | 102009123244 A | 12/2009 |
| KR | 1020110088906 A | 8/2011 |

* cited by examiner

*Primary Examiner* — Huan Hoang
(74) *Attorney, Agent, or Firm* — Volentine & Whitt, PLLC

(57) ABSTRACT

A variable resistance memory device comprises a variable resistance memory cells and a read/write circuit configured to provide a program voltage to the variable resistance memory cell, and further configured to adjust a compliance current flowing through the variable resistance memory cell in successive loops of a program operation.

18 Claims, 15 Drawing Sheets

VARIABLE RESISTANCE MEMORY DEVICE AND RELATED METHOD OF OPERATION

CROSS-REFERENCE TO RELATED APPLICATIONS

This application claims priority under 35 U.S.C. §119 to Korean Patent Application No. 10-2012-0012928 filed on Feb. 8, 2012, the subject matter of which is hereby incorporated by reference.

BACKGROUND OF THE INVENTION

The inventive concept relates generally to electronic memory technologies. More particularly, the inventive concept relates to a variable resistance memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include ferroelectric random access memory (FRAM), magnetic RAM (MRAM), phase change memory device, resistive RAM (RRAM), and flash memory.

There has been an increasing demand for nonvolatile memory devices in recent years due to a variety of technology trends, such as the proliferation of mobile devices requiring persistent data storage, as well as a general increase in the demand for personal data storage. Accordingly, researchers continue to invest resources in improving existing nonvolatile memory technologies and developing new ones.

RRAM is one type of nonvolatile memory that has showed promise. In particular, RRAM has demonstrated potential for high speed, high capacity, and low power consumption. A variable resistance material film of the RRAM shows a reversible resistance variation according to a polarity or a magnitude of an applied pulse. In some types of RRAM, a colossal magneto-resistive material layer (CMR) has a perovskite structure or a metal oxide layer with a conductive filament that is generated or disappears in response to an electric pulse and is used as a variable resistance material film. A memory including such a variable resistance material film can be referred to as a variable resistance memory.

In general, a variable resistance memory element can be classified as a unipolar element or a bipolar element according to a polarity of a write pulse. In the case of a unipolar variable resistance element, a polarity of a set pulse is identical to that of a reset pulse. In the case of a bipolar variable resistance element, a polarity of a set pulse is opposite to that of a reset pulse.

Based on the current state of RRAM and other forms of variable resistance memory, there is a general need for improved storage capacity, integration density, and general operating characteristics. Accordingly, RRAM is expected to be a subject of continuing research efforts.

SUMMARY OF THE INVENTION

In one embodiment of the inventive concept, a variable resistance memory device comprises a variable resistance memory cell, and a read/write circuit configured to provide a program voltage to the variable resistance memory cell, and further configured to adjust a compliance current flowing through the variable resistance memory cell in successive loops of a program operation.

In another embodiment of the inventive concept, a method of operating a variable resistance memory device comprises applying a first program pulse to one end of a variable resistance memory cell, applying a second program pulse to the one end of the variable resistance memory cell, and varying a compliance current flowing to the variable resistance memory cell between a first period corresponding to the first program pulse and a second period corresponding to the second program pulse.

In another embodiment of the inventive concept, a method of programming a variable resistance memory cell comprises performing a plurality of program loops on the variable resistance memory cell, each program loop comprising a program step and a verification step, and during each program step, controlling a compliance current through the variable resistance memory cell to have a different value compared with a prior program step.

These and other embodiments of the inventive concept can potentially provide improved control over program operations in variable resistance memory devices and reduced power consumption.

BRIEF DESCRIPTION OF THE DRAWINGS

The drawings illustrate selected embodiments of the inventive concept. In the drawings, like reference numbers indicate like features.

DETAILED DESCRIPTION

Figure 1:
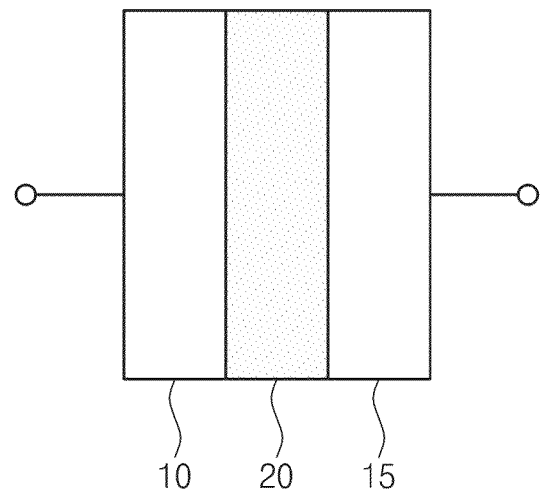
FIG. 1 is a diagram illustrating an element structure of a variable resistance memory device.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features are not to be limited by these terms. Rather, these terms are used merely to distinguish between different features. Thus, a first feature discussed below could be termed a second feature, and vice versa, without changing the meaning of the relevant description.

Spatially relative terms, such as "beneath", "below", "lower", "under", "above", "upper" and the like, may be used herein for ease of description to describe one feature's relationship to another feature(s) as illustrated in the drawings. It will be understood that the spatially relative terms are intended to encompass different orientations of the device in use or operation in addition to the orientation depicted in the drawings. For example, if the device in the drawings is turned over, features described as "below" or "beneath" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it may be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise. The terms "comprises" and/or "comprising," when used herein, indicate the presence of stated features but do not preclude the presence or addition of other features. As used herein, the term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1 is a diagram illustrating an element structure of a variable resistance memory device.

Referring to FIG. 1, a variable resistance element comprises a pair of electrodes 10 and 15 and a data storing film 20 interposed between electrodes 10 and 15. Electrodes 10 and 15 may be formed of metal, metallic oxide, or metallic nitride. For example, electrodes 10 and 15 may be formed of Al, Cu, TiN, TixAlyNz, Ir, Pt, Ag, Au, polycrystalline silicon, W, Ti, Ta, TaN, WN, Ni, Co, Cr, Sb, Fe, Mo, Pd, Sn, Zr, Zn, IrO2, or StZrO3.

Data storing film 20 may be formed of a bipolar resistance memory substance or a unipolar resistance memory substance. The bipolar resistance memory substance may be programmed to a set or reset state according to a polarity of an applied electrical pulse. The unipolar resistance memory substance may be programmed to a set or reset state by a pulse having the same polarity. The unipolar resistance memory substrate may include transient metal oxide such as NiOx or TiOx, and the bipolar resistance memory substance may include materials in the Perovskite family.

Figure 2A:
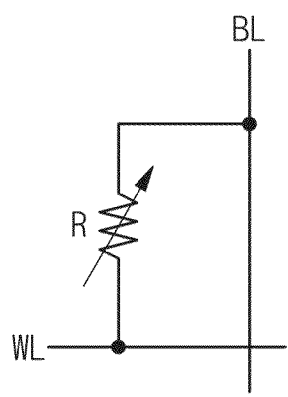
FIGS. 2A to 2D are circuit diagrams illustrating a memory cell structure of a variable resistance memory device.
Figure 2B:
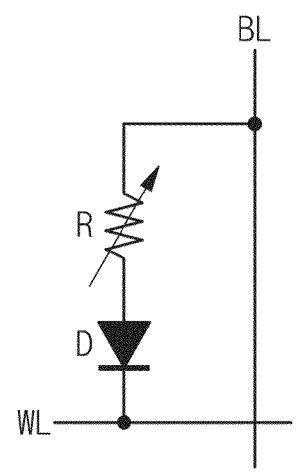
Figure 2C:
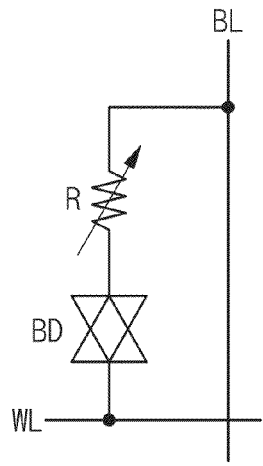
Figure 2D:
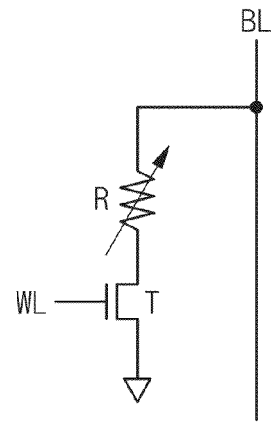

FIGS. 2A to 2D are circuit diagrams illustrating a memory cell structure of a variable resistance memory device. In particular, FIG. 2A illustrates a variable resistance memory cell without a selection element and FIGS. 2B through 2D illustrate variable resistance memory cells with different selection elements.

Referring to FIG. 2A, a variable resistance memory cell comprises a variable resistance element R connected to a bit line BL and a word line WL. Data is written in the memory cell of FIG. 2A by applying a voltage between bit line BL and word line WL.

Referring to FIG. 2B, a variable resistance memory cell comprises a variable resistance element R and a diode D. Variable resistance element R comprises a variable resistance material for storing data. Diode D functions as a selection element (or, referred to as a switching element) that selectively supplies a current to variable resistance element R according to a bias condition of word line WL and bit line BL. Diode D is connected between variable resistance element R and word line WL, and variable resistance element R is connected between bit line BL and diode D. Positions of diode D and variable resistance element R can be exchanged. Diode D may be turned on or off according to a voltage of word line WL. For example, diode D may be turned off so the variable resistance memory cell is not driven where a specific voltage is provided to word line WL.

Referring to FIG. 2C, a variable resistance memory cell comprises a variable resistance element R and a bi-directional diode BD. Variable resistance element R comprises a variable resistance material for storing data. Bi-directional diode BD is connected between variable resistance element R and word line WL, and variable resistance element R is connected between bit line BL and bi-directional diode BD. Positions of bi-directional diode BD and variable resistance element R can be exchanged. Bi-directional diode BD blocks a leakage current flowing to an unselected variable resistance memory cell.

Referring to FIG. 2D, a variable resistance memory cell comprises a variable resistance element R and a transistor T. Transistor T is a selection element (or a "switching element") that selectively supplies a current to variable resistance element R according to a voltage of word line WL. Transistor T is connected between variable resistance element R and word line WL, and variable resistance element R is connected between bit line BL and transistor T. Positions of the transistor T and variable resistance element R can be exchanged. The variable resistance memory cell can be selected or unselected according to whether transistor T is turned on or off according to a voltage of word line WL.

Although FIGS. 2A through 2D show various structures of a variable resistance memory cell, the described embodiments are not limited to these structures.

Figure 3:
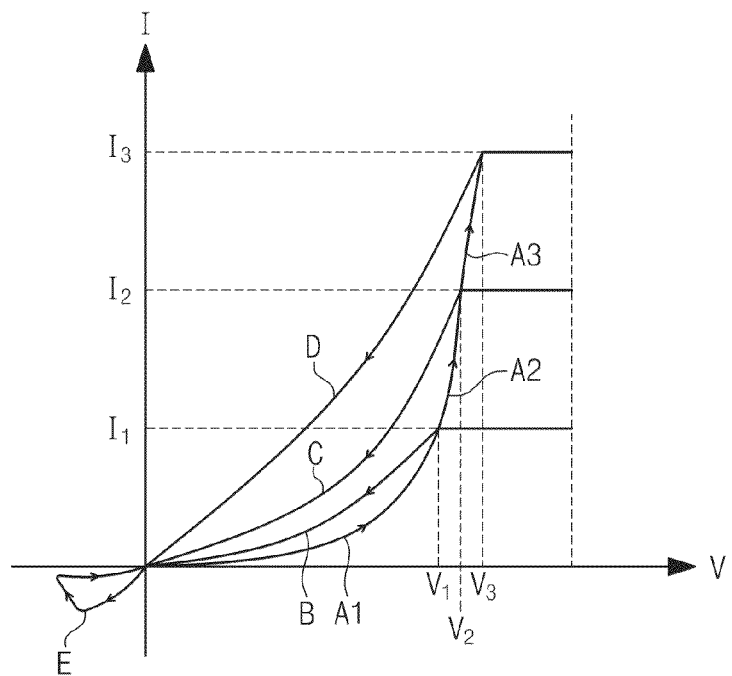
FIG. 3 is a diagram illustrating a hysteresis property of a variable resistance memory cell according to an embodiment of the inventive concept.

FIG. 3 is a diagram illustrating a hysteresis property of a variable resistance memory cell according to an embodiment of the inventive concept.

Referring to FIG. 3, a variable resistance memory cell may exhibit different hysteresis characteristics according to a magnitude of a compliance current. The hysteresis characteristic will be described with reference to a current-voltage period in which a resistance of a memory cell is switched into a reset state (e.g., a high resistance state).

Where a voltage across a memory cell increases constantly, the memory cell may be programmed to a reset state, which is a high resistance state. If voltages applied to both sides of the memory cell having a reset state have opposite polarities, a current-voltage characteristic may vary along a curve different from that when a voltage increases. This may be referred to as a hysteresis characteristic. In certain embodiments of the inventive concept, it is possible to improve the programming performance using the hysteresis characteristic when a variable resistance memory cell is programmed to a set state.

Where a voltage across a memory cell increases in a state using a first compliance current I1, a current-voltage characteristic may follow a curve A1. However, after reaching first compliance current I1, a current of a memory cell may not increase any more. At this time, only a voltage may increase. Although a voltage across a memory cell increases, first compliance current I1 may be maintained constantly. Where a memory cell is programmed to a reset state under the above conditions, an opposite polarity of voltage may be applied. In this case, a current-voltage characteristic may vary along a curve B.

Where a voltage across a memory cell increases in a state using a second compliance current I2, a current-voltage characteristic may follow a curve A1-A2. However, after reaching second compliance current I2, a current of a memory cell may not increase further, and only a voltage may increase. Although a voltage across a memory cell increases, the second compliance current I2 may be maintained constant. Where a memory cell is programmed to a reset state under the above conditions, an opposite polarity of voltage may be applied. In this case, a current-voltage characteristic may vary along a curve C.

Where a voltage across a memory cell increases in a state using a third compliance current I3, a current-voltage characteristic may follow a curve A1-A2-A3. However, after reaching second compliance current I2, a current of a memory cell may not increase further, and only a voltage may increase. Although a voltage across a memory cell increases, third compliance current I3 may be maintained constant. Where a memory cell is programmed to a reset state under the above conditions, an opposite polarity of voltage may be applied. In this case, a current-voltage characteristic may vary along a curve E. Programming to a set state is illustrated by a curve E.

As illustrated by the example of FIG. 3, where a reset state is programmed using compliance currents I1, I2, and I3, current-voltage characteristics of a memory cell may vary along various hysteresis curves with various levels of compliance current being applied.

Figure 4:
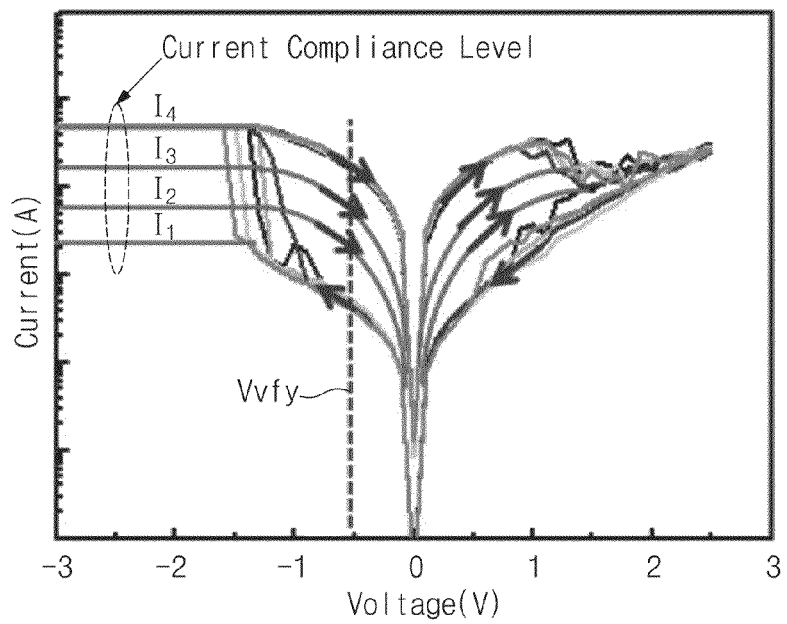
FIG. 4 is a graph illustrating a hysteresis property of a variable resistance element on a logarithmic scale.

FIG. 4 is a graph illustrating a hysteresis characteristic of a variable resistance element on a logarithmic scale.

Referring to FIG. 4, a variable resistance memory cell may have different discriminable resistance values with respect to compliance currents $I_1$, $I_2$, $I_3$, and $I_4$. A current-voltage characteristic in FIG. 4 may be alternatively described by a voltage having a polarity opposite to that in FIG. 4.

Where a voltage is applied to a variable resistance memory cell with different levels of compliance currents $I_1$, $I_2$, $I_3$, and $I_4$ being set, it may show different paths of hysteresis characteristics. Accordingly, where a verification voltage Vvfy is applied to a memory cell after programming of the memory cell at a bias state of each of the compliance currents $I_1$, $I_2$, $I_3$, and $I_4$, different levels of currents may flow via the memory cell.

By setting of a compliance current of the inventive concept, it is possible to control a switching current that rapidly increases at that instant when a variable resistance memory cell is programmed. A switching current may indicate a current that rapidly increases at a variable resistance material film at any time (e.g., at that instant when a filament is formed). Accordingly, the rapid increase in the switching current can be blocked by setting the compliance current.

As indicated by the description of FIG. 4, a resistance value of a variable resistance memory cell can be controlled by setting a compliance current. Further, a power consumed at a program operation may be reduced by limiting a switching current.

Figure 5:
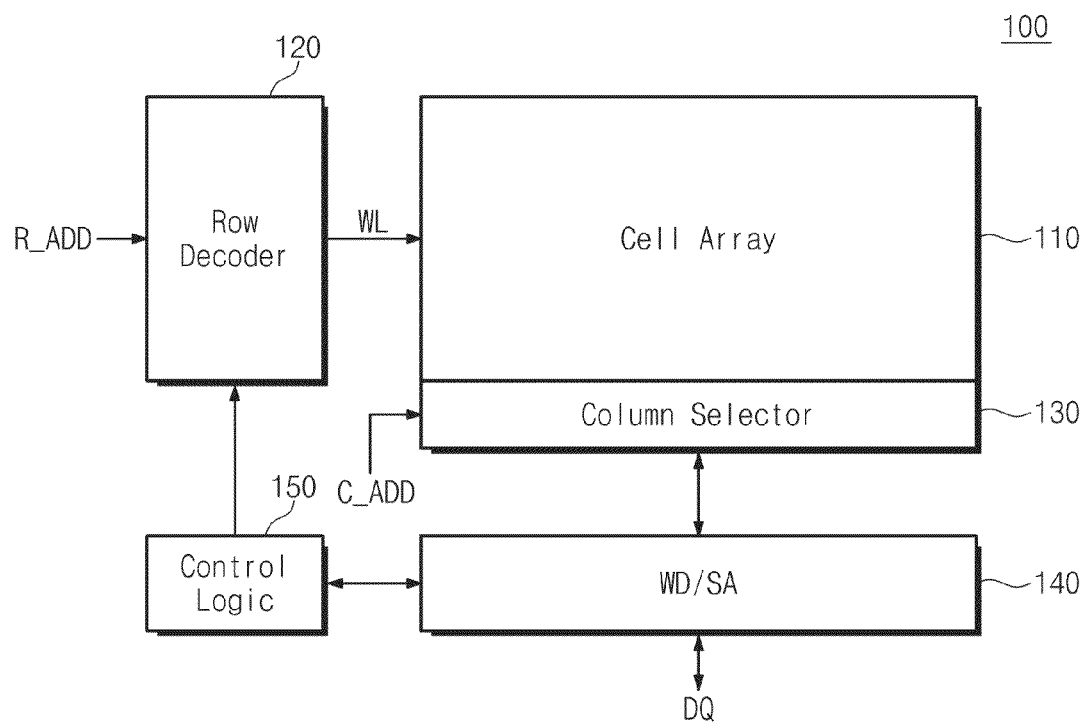
FIG. 5 is a block diagram illustrating a variable resistance memory device according to an embodiment of the inventive concept.

FIG. 5 is a block diagram illustrating a variable resistance memory device according to an embodiment of the inventive concept.

Referring to FIG. 5, a variable resistance memory device 100 comprises a cell array 110, a row decoder 120, a column selector 130, a read/write circuit 140, and control logic 150.

Cell array 110 comprises multiple variable resistance memory cells, which can be formed of any one of memory cells illustrated in FIGS. 2A to 2D, for example. A program voltage or a verification voltage may be applied to a variable resistance element of a memory cell via a word line and a bit line. Herein, certain embodiments will be described with reference to an example where a program voltage or a program current is applied via a bit line. However, the inventive concept is not limited to this example. Alternatively, for instance, a program voltage or a program current can be applied via a word line.

Cell array 110 can be formed with a two-dimensional plane structure. Alternatively, the cell array may be formed to have a three-dimensional structure. Cell array 110 comprises word line planes WL stacked in a vertical direction and channels or bit lines formed in a vertical direction. An electrode and a data storing film may be formed between each word line plane and a channel connected to a bit line.

Row decoder 120 decodes a row address R_ADD to select one of multiple word lines of cell array 110. Row decoder 120 supplies a ground voltage to a selected word line and an inhibition voltage Vinb for blocking a leakage current to unselected word lines.

Column selector 130 selects at least one of multiple bit lines based on a column address C_ADD. A bit line selected by column selector 130 is connected to read/write circuit 140.

Under the control of control logic 150, read/write circuit 140 writes input data in the cell array or reads data from cell array 110 to output it to an external device. At a read operation, the read/write circuit 140 may provide a read voltage to a selected bit line. Read/write circuit 140 detects a sensing current flowing to a selected memory cell according to the read voltage to determine data stored in the selected memory cell.

In a write operation, read/write circuit 140 supplies a program voltage to a selected bit line. Read/write circuit 140 gradually varies a compliance current Ic when a memory cell is programmed to a set state, which is a low resistance state, from a reset state, which is a high resistance state. Similarly, read/write circuit 140 gradually varies a compliance current Ic where a memory cell is programmed to the reset state from the set state.

Read/write circuit 140 supplies a selected memory cell with a gradually increasing compliance current Ic via a selected bit line. At this time, a write voltage synchronized with a pulse of the compliance current is applied to the selected bit line. Read/write circuit 140 provide a verification voltage Vvfy for detecting a result of a write operation. Read/write circuit 140 provides control logic 150 with a verification result obtained using verification voltage Vvfy.

Control logic 150 controls read/write circuit 140 and row decoder 120 in response to a write or read command CMD. Control logic 150 controls read/write circuit 140 and row decoder 120 to synchronize a word line voltage and a bit line voltage of a selected memory cell. In a program operation, control logic 150 determines progress of a write loop of a selected memory cell based on a verification result from read/write circuit 140. If the selected memory cell is determined to have a target resistance value, control logic 150 may interrupt a program loop to terminate the program operation.

As indicated by the above description, in a program operation, variable resistance memory device 100 provides a compliance current to the selected memory cell in a gradually increasing step pulse manner. This enables the selected memory cell to be finely programmed to a target set or reset state. Variable resistance memory device 100 may reduce a switching current, which rapidly increases at that instant when a variable resistance element is programmed, by setting a compliance current. Thus, a power consumed in the program operation may be reduced.

Figure 6:
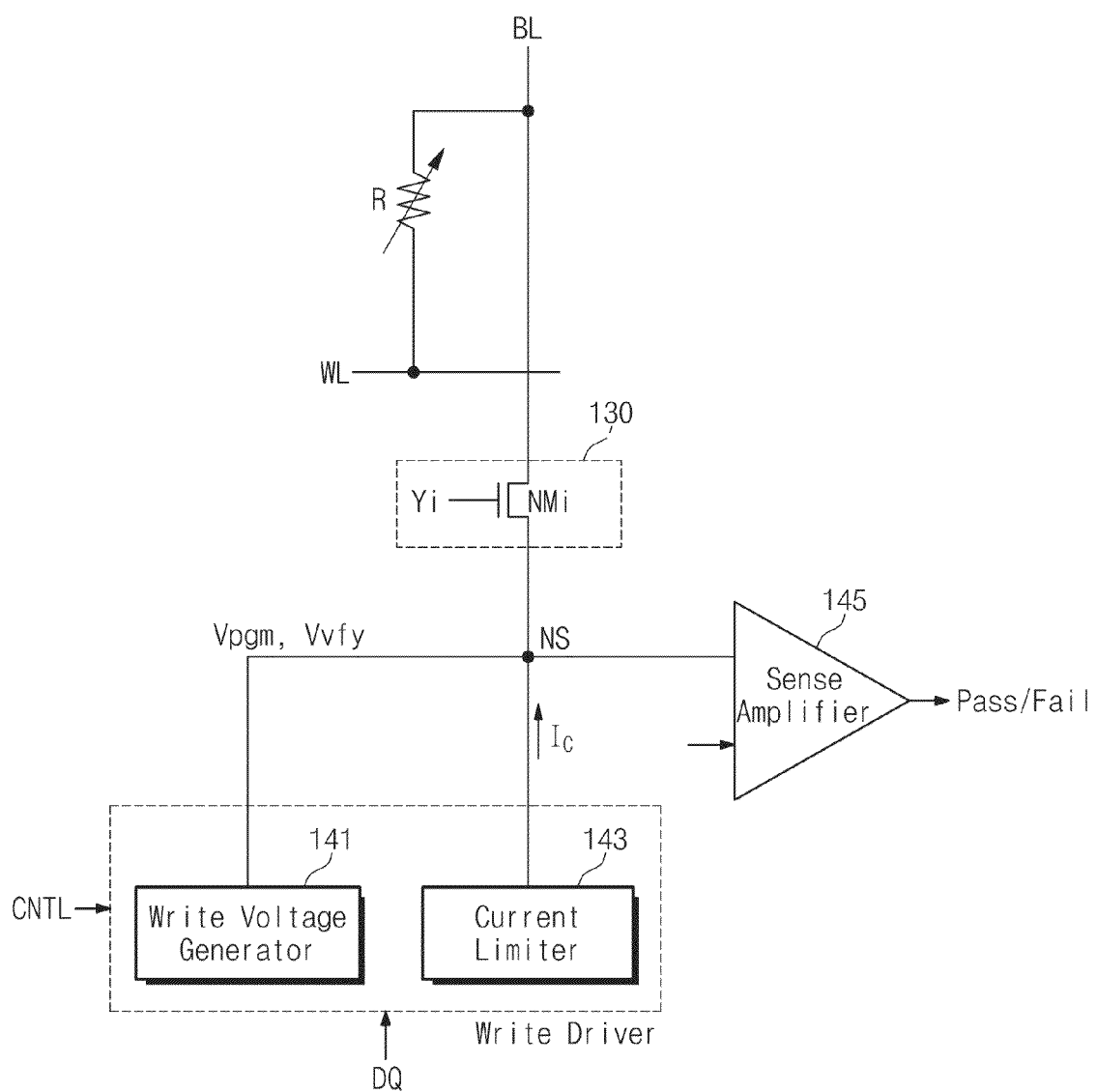
FIG. 6 is a block diagram illustrating a read/write circuit in FIG. 5 according to an embodiment of the inventive concept.

FIG. 6 is a block diagram illustrating an example of read/write circuit 140 of FIG. 5.

Referring to FIG. 6, read/write circuit 140 comprises a write voltage generator 141, a current limiter 143, and a sense amplifier 145

Write voltage generator 141 provides a selected bit line BL with a write voltage for writing data. The write voltage may include a program voltage Vpgm and a verification voltage Vvfy. Program voltage Vpgm may be a pulse for programming a selected memory cell to a set state, and verification voltage Vvfy may be a voltage for detecting whether a resistance value of a memory cell is over a reference value. Each of the program and verification voltages Vpgm and Vvfy may be a pulse voltage having a constant pulse width. Program voltage Vpgm may be a gradually increasing step pulse. Program and verification voltages Vpgm and Vvfy may be transferred to a node NS to be connected to a bit line. Program voltage Vpgm or verification voltage Vvfy transferred to node NS may be provided to bit line BL via a transistor NMi of column selector 130. Program voltage Vpgm or verification voltage Vvfy transferred to bit line BL may be transferred to a word line WL via a resistance element R of a memory cell.

Current limiter 143 provides a compliance current Ic applied during a write operation of the memory cell. Current limiter 143 sets a value of current provided to the memory cell in synchronization with program voltage Vpgm. Current limiter 143 provides compliance current Ic provided in synchronization with a pulse period of program voltage Vpgm. A more detailed example of current limiter 143 is described with reference to FIG. 7.

Sense amplifier 145 senses an electric signal on node NS at a time where verification voltage Vvfy is provided. For example, sense amplifier 145 may detect a resistance value of the memory cell by sensing current flowing to a memory cell at a time where the verification voltage Vvfy is provided. Where the detected resistance value of the memory cell is determined to be over or below a target resistance value, sense amplifier 145 transmits a pass signal Pass to control logic 150. On the other hand, where the detected resistance value of the memory cell is determined not to reach a target resistance range, sense amplifier 145 may send a fail signal Fail to control logic 150.

Read/write circuit 140 provides compliance current Ic to a memory cell with a gradually increasing or decreasing value. Thus, it is possible to finely control a variation in a resistance value of a memory cell affected by compliance current Ic.

Figure 7:
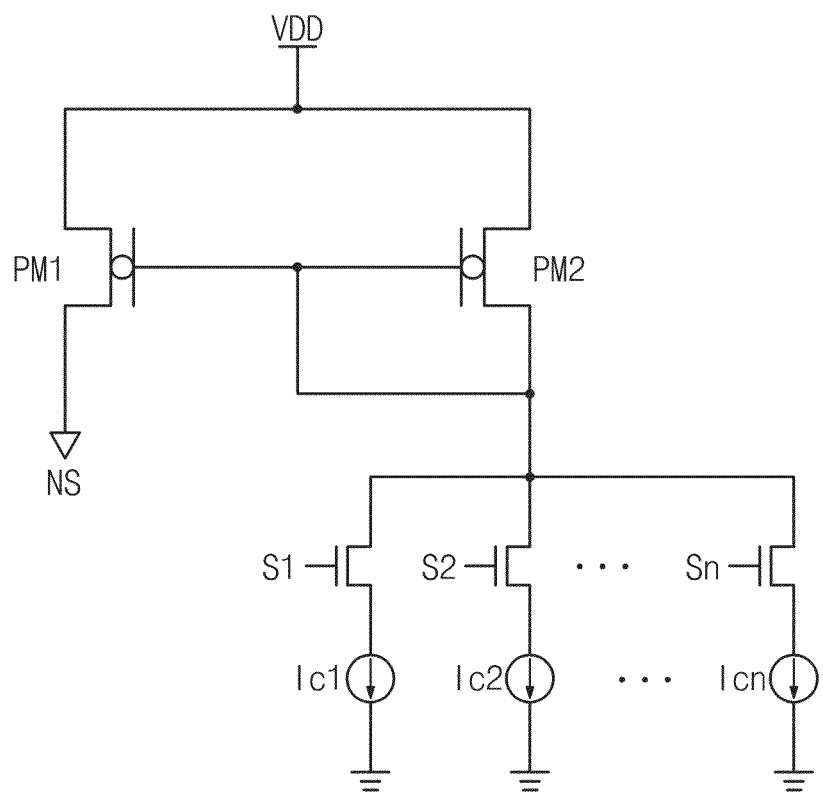
FIG. 7 is a circuit diagram illustrating a current limiter in FIG. 6 according to an embodiment of the inventive concept.

FIG. 7 is a circuit diagram illustrating an example of current limiter 143 of FIG. 6.

Referring to FIG. 7, current limiter 143 is formed of a current minor. Current limiter 143 comprises a PMOS transistor PM1 connected to a node NS (connected to a bit line BL) and a PMOS transistor PM2 connected to multiple current sources Ic1 to Icn. Current sources Ic1 to Icn provide different current values. Current sources Ic1 to Icn may be switched by selection signal S1 to Sn according to an increase in a program loop number. A magnitude of a current supplied to a memory cell may be limited by selecting at least one of current sources Ic1 to Icn in response to selection signals S1 to Sn.

Although FIG. 7 shows an example where current limiter 143 is implemented with a current mirror, the inventive concept is not limited to this example. For instance, in some embodiments, current limiter 143 may be configured to stepwise or gradually increase an upper limit of a current applied to a memory cell according to an increase in a program loop number.

Figure 8A:
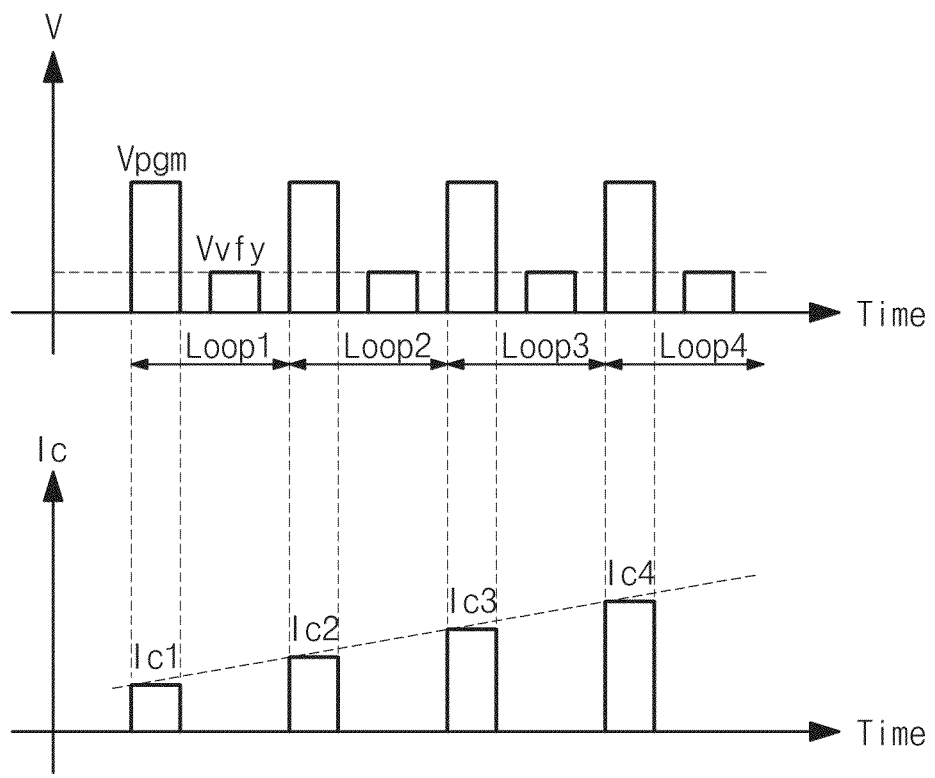
FIG. 8A is a diagram illustrating a write operation of a read/write circuit according to an embodiment of the inventive concept.

FIG. 8A is a diagram illustrating a write operation of a read/write circuit according to an embodiment of the inventive concept.

Referring to FIG. 8A, read/write circuit 140 provides a memory cell with a program voltage pulse Vpgm, a verification voltage pulse Vvfy, and a compliance current pulse Ic.

In the write operation, read/write circuit 140 applies a program voltage pulse Vpgm to a bit line of a selected memory cell. At the same time, read/write circuit 140 supplies a first compliance current Ic1 to the selected memory cell. A pulse period of the first compliance current Ic1 is synchronized with a pulse period of the program voltage Vpgm. A resistance value of a variable resistance material of the selected memory cell may vary according to the program voltage Vpgm. However, a variation of a resistance value of the selected memory cell may be limited by the first compliance current Ic1. Although a filament is formed at the variable resistance element of the selected memory cell, a switching current or a cell current may not exceed first compliance current Ic1.

After program voltage Vpgm and compliance current Ic1 are applied, verification voltage Vvfy may be applied to a memory cell. First compliance current Ic1 may be blocked when verification voltage Vvfy is applied. A cell current flowing to a bit line according to verification voltage Vvfy may be sensed by sense amplifier 145. A resistance value of the selected memory cell may be estimated according to the sensed current and verification voltage Vvfy. Where the estimated resistance value does not reach a target resistance range, sense amplifier 145 may send a fail signal Fail to control logic 150. Where the estimated resistance value is determined to reach the target resistance range, sense amplifier 145 transmits a pass signal Pass to control logic 150.

Operations for applying the program voltage Vpgm, first compliance current Ic1, and the verification voltage Vvfy constitute a first loop. Where the selected memory cell is determined not to be programmed to a target resistance value at the first loop, a program operation of a second loop may be performed.

A program voltage Vpgm and a second compliance current Ic2 may be supplied to the selected memory cell at the second loop. The selected memory cell is verified using verification voltage Vvfy. The compliance current is gradually increased according to iteration of loops. The compliance current may be varied until the selected memory cell is programmed to a target resistance value.

Figure 8B:
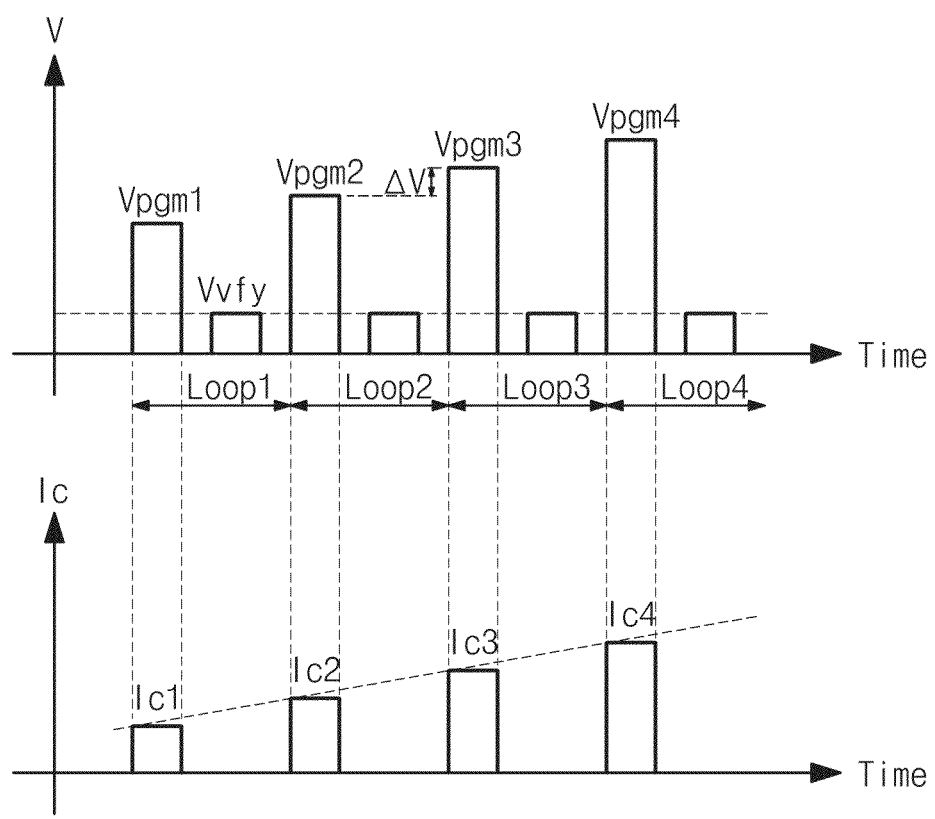
FIG. 8B and 8C are diagrams illustrating a write operation of a read/write circuit according to other embodiments of the inventive concept.
Figure 8C:
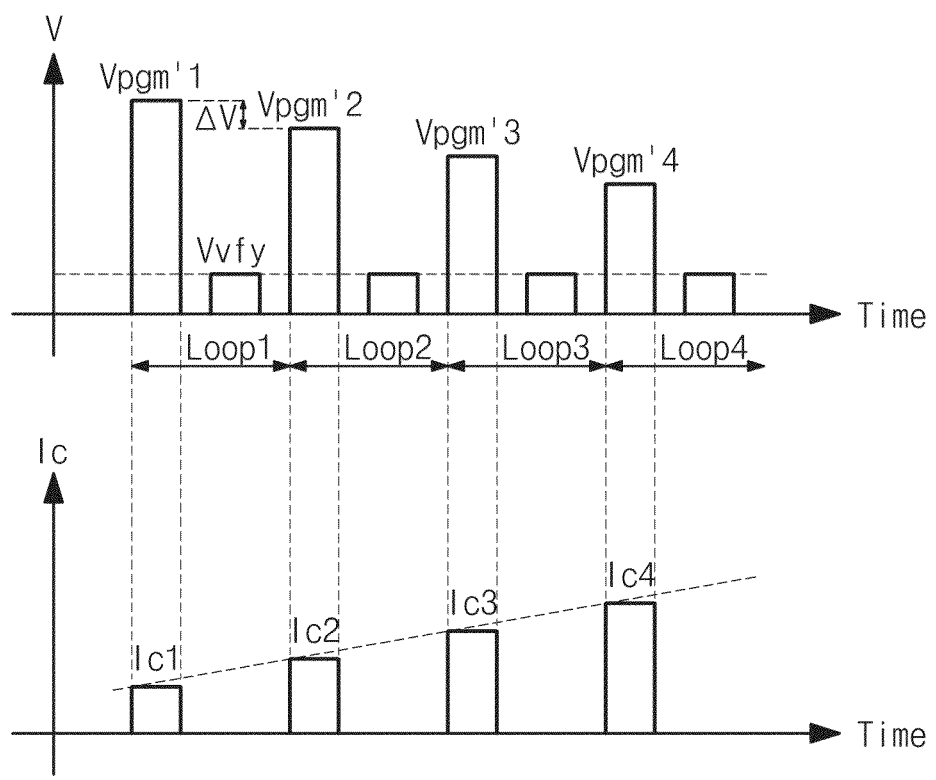

FIG. 8B and 8C are diagrams describing a write operation of a read/write circuit according to other embodiments of the inventive concept. Referring to FIG. 8B, a read/write circuit 140 may provide a selected memory cell with a program voltage Vpgm, a verification voltage Vvfy, and a compliance current Ic. The program voltage Vpgm may gradually increase at iteration of loops. On the other hand, as illustrated in FIG. 8C, the program voltage Vpgm may gradually decrease at iteration of loops.

Figure 9:
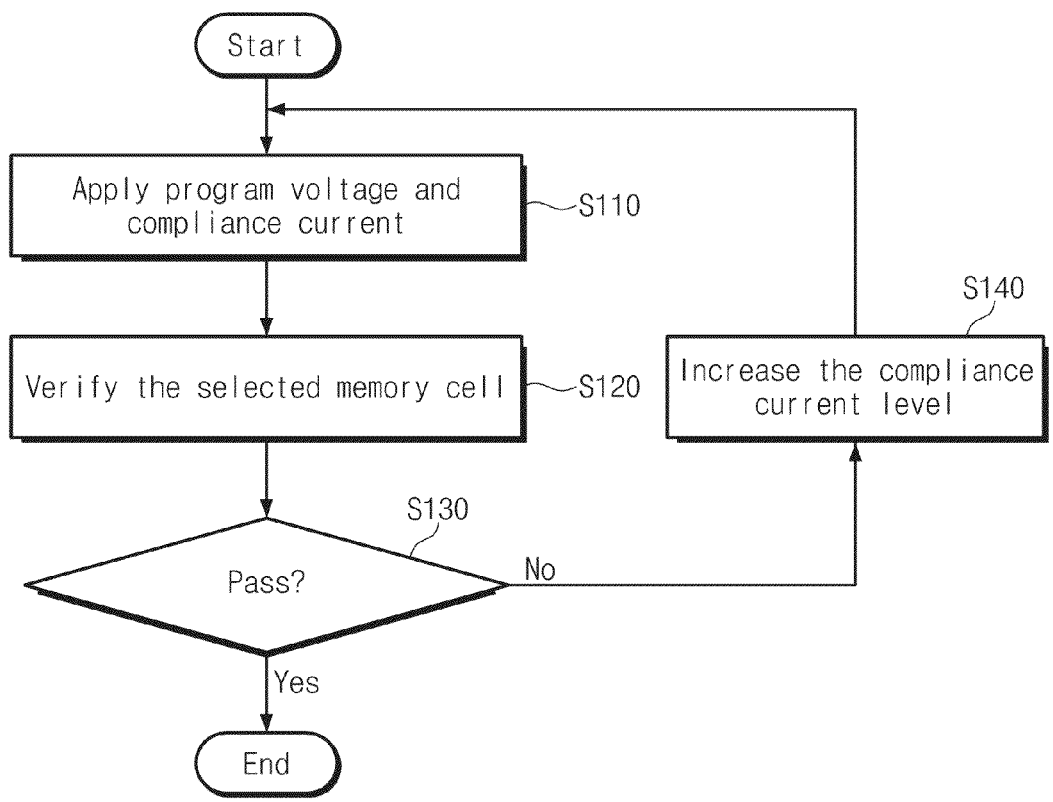
FIG. 9 is a flowchart illustrating a write method of a variable resistance memory device according to an embodiment of the inventive concept.

FIG. 9 is a flowchart describing a write method of a variable resistance memory device according to an embodiment of the inventive concept. Referring to FIG. 9, a level of a compliance current applied to a memory cell may gradually increase at iteration of program loops. A resistance value of a memory cell may be easily set to a target resistance value by gradually increasing the compliance current flowing to the memory cell.

In operation S110, read/write circuit 140 applies a program voltage pulse Vpgm to a bit line of a selected memory cell. At the same time, read/write circuit 140 limits a current flowing to the selected memory cell to a compliance current Ic1.

In operation S120, read/write circuit 140 verifies whether the selected memory cell is programmed. For example, read/write circuit 140 may apply a verification voltage Vvfy to a bit line BL to sense a cell current flowing to a sensing node NS. A resistance value of the selected memory cell is estimated according to the sensed cell current and verification voltage Vvfy.

In operation S130, if control logic 150 determines that the selected memory cell is normally programmed, the write method ends. However, if a resistance value of the selected memory cell is judged not to reach a target range, the method proceeds to operation S140.

In operation S140, current limiter 143 increases the compliance current from Ic1 to Ic2. Afterwards, the method proceeds to operation S110 in which the selected memory cell is programmed. In response to a program failure, operations S110, S120, S130, and S140 may be repeated. The operations S110, S120, S130, and S140 may form a program loop described in FIG. 8.

Figure 10:
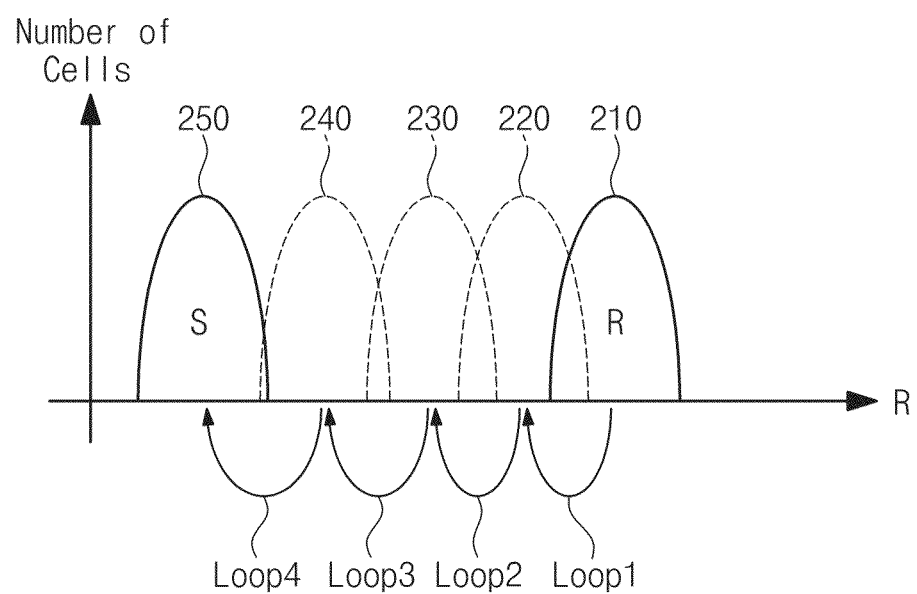
FIG. 10 is a diagram illustrating a variation in a resistance value of a memory cell at a write operation according to an embodiment of the inventive concept.

FIG. 10 is a diagram illustrating a variation in a resistance value of a memory cell in a write operation according to an embodiment of the inventive concept.

Referring to FIG. 10, a memory cell has a reset state 210 corresponding to a high resistance state and a set state 250 corresponding to a low resistance state. For ease of description, distributions corresponding to two states 210 and 250 are illustrated in FIG. 10. However, the inventive concept is not limited thereto. For example, in case of a multi-level cell, a memory cell may have plural, for example, four or more resistance states.

A resistance value of a selected memory cell is shifted to a set state having a low resistance value from a reset state according to iteration of program loops. A resistance value of the selected memory cell is prevented from being rapidly lowered below a specific value by controlling the compliance current being an upper limit of a current flowing to the selected memory cell at a point of time when a program voltage is applied.

Figure 11:
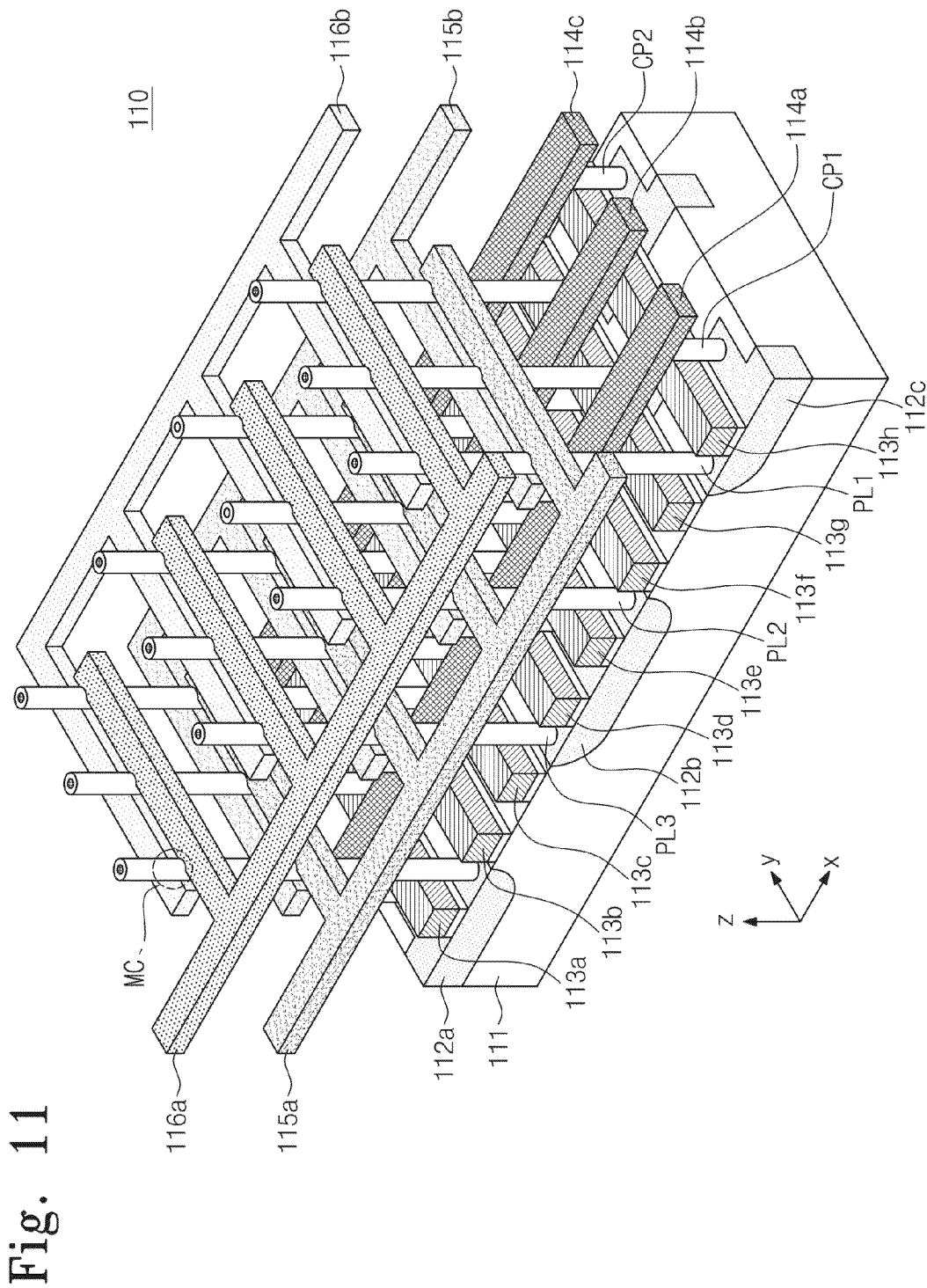
FIG. 11 is a perspective view illustrating a three-dimensional structure of a memory cell array in FIG. 5 according to an embodiment of the inventive concept.

FIG. 11 is a perspective view illustrating a three-dimensional structure of a memory cell array 110 of FIG. 5.

Referring to FIG. 11, memory cell array 110 comprises structures extending along multiple directions x, y, and z. A substrate 111 is provided to form memory cell array 110. For example, substrate 111 may be formed of a p-well in which an element such as boron is injected. Alternatively, substrate 111 may be a pocket p-well provided within an n-well. Hereinafter, it is assumed that substrate 111 is a p-well. However, substrate 111 is not limited thereto.

Multiple doping regions 112a to 112c are formed at substrate 111. For example, doping regions 112a to 112c may be formed of an n-type conductor different from substrate 111. However, the inventive concept is not limited thereto. Doping regions 112a to 112c are formed sequentially in the x-axis direction. This structure may be iterated in the y-axis direction. Word lines 113a to 113h connected to metal lines formed at multiple layers are formed over doping regions 112a to 112c to be electrically isolated from doping regions 112a to 112c.

Doping regions 112a to 112c are connected by multiple bit lines 114a to 114c extending in the x-axis direction and contact plugs CP1 and CP2. Doping regions 112a to 112c are connected with bit lines 114a to 114c and vertical electrodes of multiple pillars PL1 to PL4. That is, bit lines may be connected to vertical electrodes of the pillars PL1 to PL4 by doping regions 112a to 112c. Each of pillars PL1 to PL4 is connected with metal lines 115a, 115b, 116a, and 116b stacked at multiple layers. Metal lines 115a and 115b connected to pillars at multiple metal layers in a comb shape are connected to a global word line.

Memory cell array 110 of the resistive memory device may be formed according to the above description to have a three-dimensional structure. However, the inventive concept is not limited thereto. Resistive memory cells can be stacked in various manners.

Figure 12:
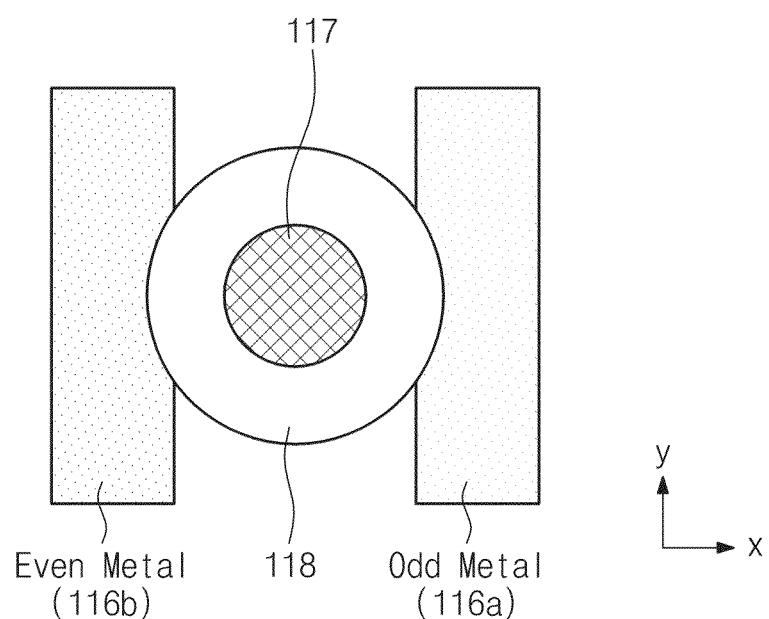
FIG. 12 is a cross-sectional view of a variable resistance memory cell formed at one layer in FIG. 11 according to an embodiment of the inventive concept.

FIG. 12 is a cross-sectional view of a variable resistance memory cell formed at one layer in FIG. 11.

Referring to FIG. 12, a memory cell MC comprises a pillar 117 and 118 between a first metal 116a and a second metal 116b. A pillar penetrating in a direction (a z-axis direction) perpendicular to a substrate is formed between metal lines 116a and 116b forming a horizontal electrode. The pillar comprises a data storing film 118 and a vertical electrode 117 that are formed in a cylindrical shape. A variable resistance memory cell is formed by vertical electrode 117 connected to a bit line and metal lines 116a and 116b connected to a word line. Data storing film 118 is formed in a vertical direction by etch and deposition processes. Vertical electrode 117 is formed by a deposition process, for example, a physical vapor deposition (PVD), chemical vapor deposition (CVD), or atomic vapor deposition (AVD).

Figure 13:
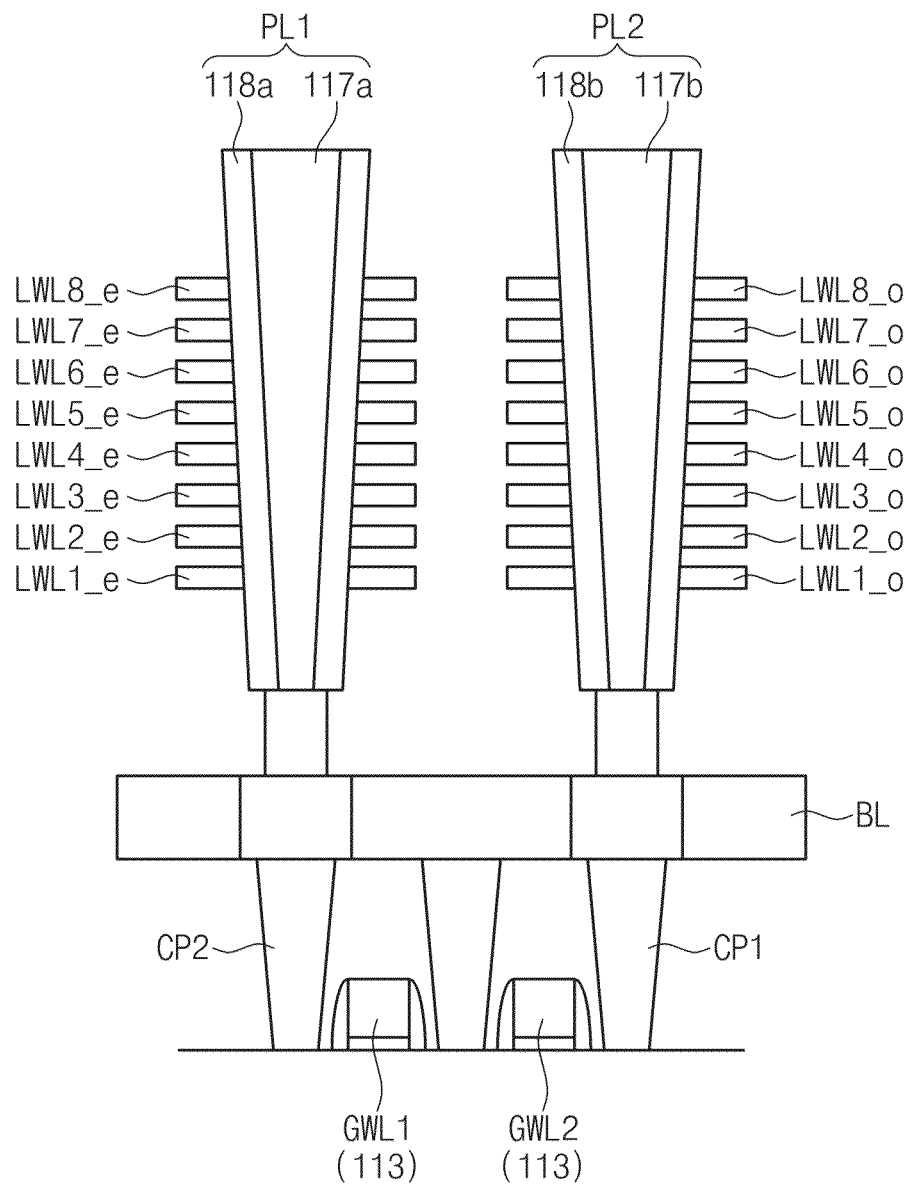
FIG. 13 is a cross-section view of a memory cell array in FIG. 11 according to an embodiment of the inventive concept.

FIG. 13 is a cross-sectional view of memory cell array 110 of FIG. 11.

Referring to FIG. 13, memory cell array 110 comprises pillars PL1 and PL2 forming a vertical electrode and a variable resistance memory cell, multiple horizontal electrodes LWL1_e to LWL8_e and LWL1_o to LWL8_o stacked in a direction perpendicular to a substrate; bit lines connected to bit lines via doping regions; and global word lines GWL1 and GWL2 for providing a word line voltage to multiple horizontal electrodes.

Figure 14:
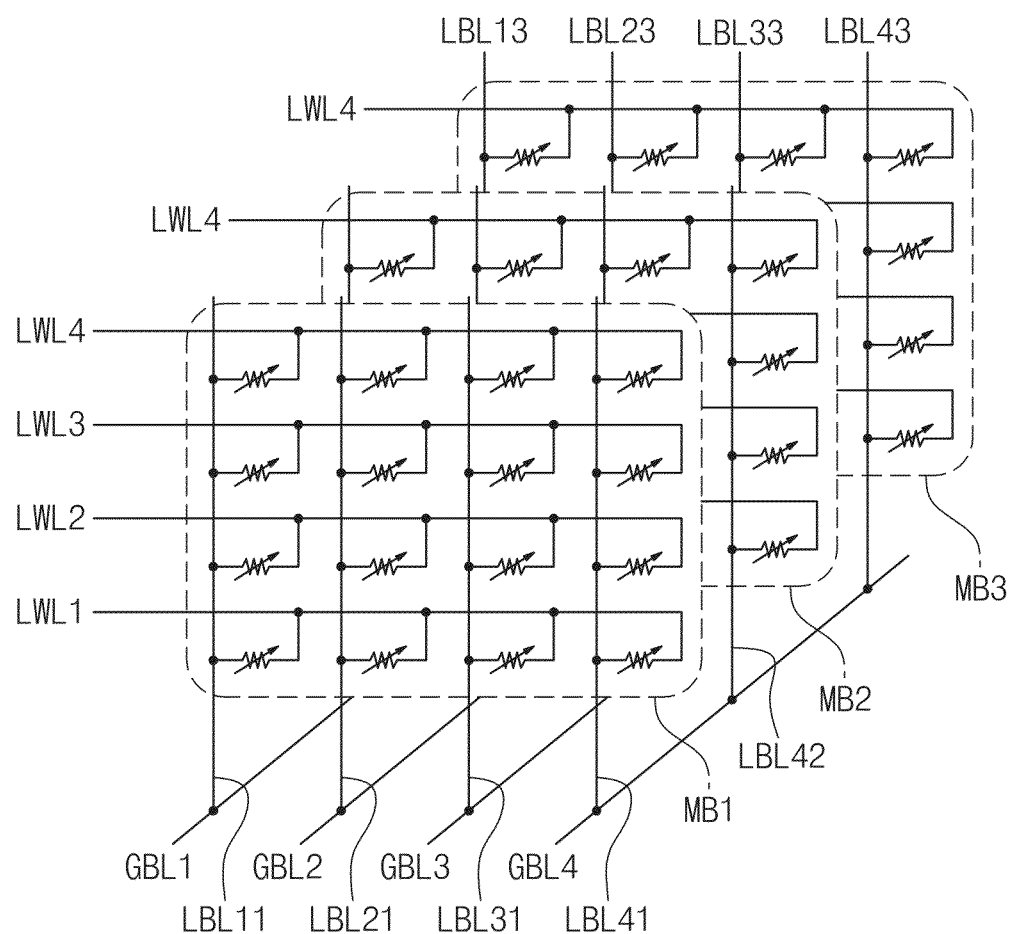
FIG. 14 is a circuit diagram illustrating a memory cell array in FIG. 11 according to an embodiment of the inventive concept.

FIG. 14 is a circuit diagram of memory cell array 110 of FIG. 11.

Referring to FIG. 14, a memory cell array 110 may include multiple memory blocks MB1 to MB3 that form one unit at an x-z plane.

Memory cell array 110 comprises multiple local bit lines extending in parallel in an z-axis direction and multiple local word lines LWL1 to LWL4 extending in parallel in a y-axis direction perpendicular to the z-axis direction. Although not shown in figures, each of the memory blocks MB1 to MB3 may be connected to different local word lines.

Local bit lines LBL11 to LBL43 formed by vertical channels of pillars are connected to global bit lines GBL1 to GBL4, respectively. Variable resistive memory cells of memory cell array 110 are connected to the local word lines LWL1 to LWL4 or local bit lines LBL11 to LBL43. Variable resistive memory cells are programmed or sensed by voltages applied to the local word lines LWL1 to LWL4 or the local bit lines LBL11 to LBL43.

Figure 15:
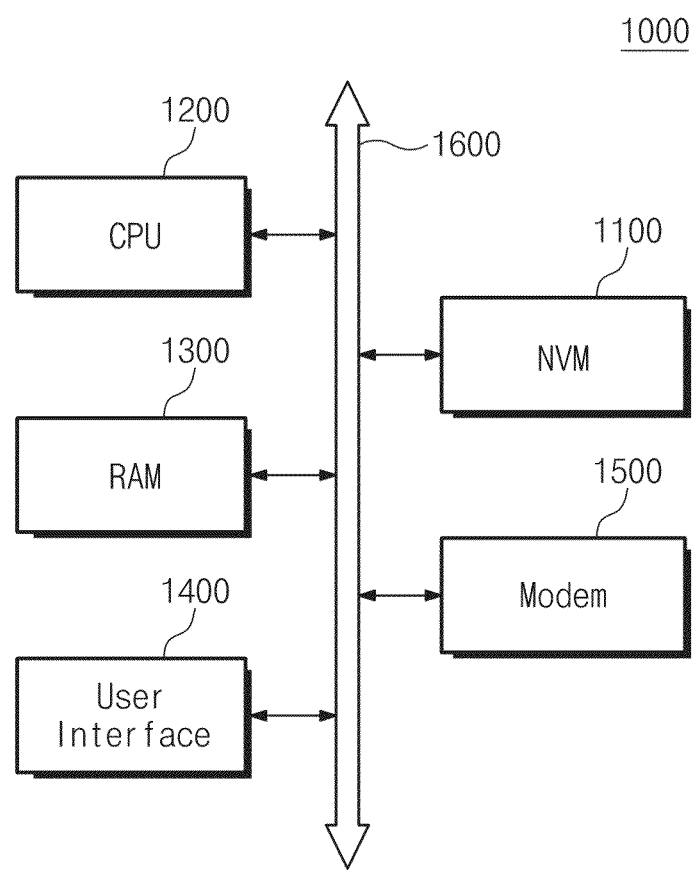
FIG. 15 is a block diagram illustrating a computing system comprising a nonvolatile memory device according to an embodiment of the inventive concept.

FIG. 15 is a block diagram illustrating a computing system 1000 comprises a nonvolatile memory device according to an embodiment of the inventive concept.

Referring to FIG. 15, computing system 1000 comprises a nonvolatile memory device 1100, a microprocessor 1200, a RAM 1300, a user interface 1400, and a modem 1500 such as a baseband chipset, which are electrically connected to a bus. Nonvolatile memory device 1100 may include over-writable variable resistance memory cells. Nonvolatile memory device 1100 gradually varies a compliance current of a selected memory cell at a program operation according to an embodiment of the inventive concept. Thus, it is possible to secure the integrity of data stored in a memory cell and to reduce power consumption at a program operation by limitation of a switching current.

Where computing system 1000 is a mobile device, it may further include a battery (not shown) as a powers supply. Although not shown in FIG. 15, computing system 1000 may further include additional features such as an application chipset, a camera image processor (CIS), a mobile DRAM, and the like.

A resistive memory device according to various embodiments described above may be packaged in any of several packages or package configurations such as Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A variable resistance memory device, comprising:
a variable resistance memory cell; and
a read/write circuit configured to provide a program voltage to the variable resistance memory cell, and further configured to adjust a compliance current of the variable resistance memory cell in successive loops of a program operation;
wherein the read/write circuit generates the program voltage of plurality of pulses in a sequence,
wherein the compliance current corresponds to an upper limit of current to flow through the variable resistance memory cell in each of the successive loops, and
wherein, within each of the successive loops, the program voltage determines an amount of current to flow through the variable resistance memory cell before the amount reaches a level of the compliance current, and thereafter the amount is restricted to the level of the compliance current in spite of the program voltage.

2. The variable resistance memory device of claim 1, wherein the plurality of pulses have increasing magnitudes and are applied to the variable resistance memory cell in the successive program loops, respectively.

3. The variable resistance memory device of claim 1, wherein the read/write circuit generates a verification voltage to detect a program state of the variable resistance memory cell after each of the plurality of pulses.

4. The variable resistance memory device of claim 3, wherein the read/write circuit detects a resistance value of the variable resistance memory cell based on a current flowing through the variable resistance memory cell in response to the verification voltage.

5. The variable resistance memory device of claim 4, further comprising control logic configured to determine progress of the program operation based on the resistance value.

6. The variable resistance memory device of claim 1, wherein the read/write circuit comprises:
a write voltage generator that applies the program voltage to a bit line connected to the variable resistance memory cell; and
a current limiter connected to the bit line to limit the current through the variable resistance memory cell.

7. The variable resistance memory device of claim 6, wherein the current limiter comprises a current mirror that controls current through the bit line to increase in the successive program loops.

8. The variable resistance memory device of claim 1, wherein the variable resistance memory cell is programmed from a first state to a second state corresponding to a resistance value smaller than that of the first state.

9. The variable resistance memory device of claim 1, wherein the variable resistance memory cell is in a three-dimensional cell array stacked in a vertical direction.

10. A method of operating a variable resistance memory device, comprising:
applying a first program pulse to one end of a variable resistance memory cell;
applying a second program pulse to the one end of the variable resistance memory cell; and
varying a compliance current of the variable resistance memory cell between a first period corresponding to the first program pulse and a second period corresponding to the second program pulse;
wherein the compliance current corresponds to an upper limit of current to flow through the variable resistance memory cell in each of the first and second periods, and
wherein, within the first and second periods, the respective first and second program pulses determine an amount of current to flow through the variable resistance memory cell before the amount reaches a level of the compliance current, and thereafter the amount is restricted to the level of the compliance current in spite of the first and second program pulses.

11. The method of claim 10, wherein the compliance current is lower in the first period than in the second period.

12. The method of claim 10, wherein the variable resistance memory cell is programmed from a reset state corresponding to a high resistance state to a set state corresponding to a low resistance state.

13. The method of claim 10, further comprising verifying whether a resistance value of the variable resistance memory cell is shifted to a target level by the first program pulse.

14. A method of programming a variable resistance memory cell, comprising:

performing a plurality of program loops on the variable resistance memory cell, each program loop comprising a program step and a verification step; wherein each program step comprises applying a program voltage as a pulse to the variable resistance memory cell; and during each program step, controlling a compliance current through the variable resistance memory cell to have a different value compared with a prior program step, wherein the compliance current corresponds to an upper limit of current to flow through the variable resistance memory cell in the program step of each of the program loops, and wherein, within each of the program loops, the program voltage determines an amount of current to flow through the variable resistance memory cell before the amount reaches a level of the compliance current, and thereafter the amount is restricted to the level of the compliance current in spite of the program voltage.

15. The method of claim 14, wherein the compliance current is controlled to have a larger value in each successive program loop.

16. The method of claim 15, wherein a program voltage applied to the variable resistance memory cell has a smaller value in the program step of each successive program loop.

17. The method of claim 15, wherein a program voltage applied to the variable resistance memory cell has substantially the same value in the program step of each successive program loop.

18. The method of claim 15, wherein a program voltage applied to the variable resistance memory cell has a larger value in the program step of each successive program loop.

* * * * *